(12) United States Patent
Loeda Pagliano

(10) Patent No.: US 8,878,711 B1
(45) Date of Patent: Nov. 4, 2014

(54) ANALOG TO DIGITAL CONVERTER WITH LOW JITTER SENSITIVITY

(71) Applicant: Broadcom Corporation, Irvine, CA (US)

(72) Inventor: Sebastian Loeda Pagliano, Sydney (AU)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/015,294

(22) Filed: Aug. 30, 2013

Related U.S. Application Data

(60) Provisional application No. 61/860,076, filed on Jul. 30, 2013.

(51) Int. Cl.
*H03M 3/00* (2006.01)

(52) U.S. Cl.
CPC *H03M 3/32* (2013.01); *H03M 3/37* (2013.01); *H03M 3/464* (2013.01); *H03M 3/454* (2013.01)

USPC .......................... 341/143; 341/118; 341/155

(58) Field of Classification Search
CPC ........ H03M 3/37; H03M 3/454; H03M 3/464
USPC .......................................... 341/118, 143, 155
See application file for complete search history.

(56) References Cited

U.S. PATENT DOCUMENTS

| | | | |
|---|---|---|---|
| 7,183,957 B1 * | 2/2007 | Melanson | 341/143 |
| 7,535,392 B2 * | 5/2009 | Weng et al. | 341/143 |
| 7,852,249 B2 * | 12/2010 | Oliaei | 341/143 |

* cited by examiner

*Primary Examiner* — Khai M Nguyen
(74) *Attorney, Agent, or Firm* — Brinks Gilson & Lione

(57) ABSTRACT

An analog-to-digital converter includes an integrator to determine an integrated signal from a communication signal. A comparator quantizes the integrated signal to produce a quantized signal. An adjustable delay element provides a delayed quantized signal to the comparator.

20 Claims, 4 Drawing Sheets

US 8,878,711 B1

ANALOG TO DIGITAL CONVERTER WITH LOW JITTER SENSITIVITY

PRIORITY CLAIM

This application claims priority to U.S. Provisional Application Ser. No. 61/860,076, filed Jul. 30, 2013, which is incorporated herein by reference in its entirety.

TECHNICAL FIELD

This disclosure relates to analog-to-digital converters. This disclosure also relates to signal transfer function, gain-bandwidth and feedback delay compensated, feed-forward continuous-time sigma-delta analog-to-digital converters.

BACKGROUND

An analog-to-digital converter (ADC) includes an electronic device that receives an analog signal. The analog-to-digital converter samples the received signal and outputs a signal representing a digital value. The digital value may be acquired in operations whose outputs represent a number of bits. The ADC may be used to sample a variety of analog waveforms in the form of radio-frequency wave, sound waves, or voltage signal.

BRIEF DESCRIPTION OF THE DRAWINGS

The innovation may be better understood with reference to the falling drawings and description. In the figures, like reference numerals designate corresponding parts throughout the different views.

DETAILED DESCRIPTION

Analog-to-digital converters (ADC) can be important components in radio frequency (RF) receiver architectures. Some receiver architectures can have small geometries and low power objectives, e.g., in mobile applications. For other architectures, smooth blocker performance can be relevant with a crowded spectrum and integration of receivers. Resolution and dynamic range of the ADC's, whether for a straight ADC or flash ADC, can rely on a precision of the matching of the receiver components and low noise. The following description can provide an ADC architecture for user equipment that provides a wide-band, with one or more of a high dynamic range ADC, a small footprint, overload recovery and power savings. Other implementations may also be possible.

Figure 1:
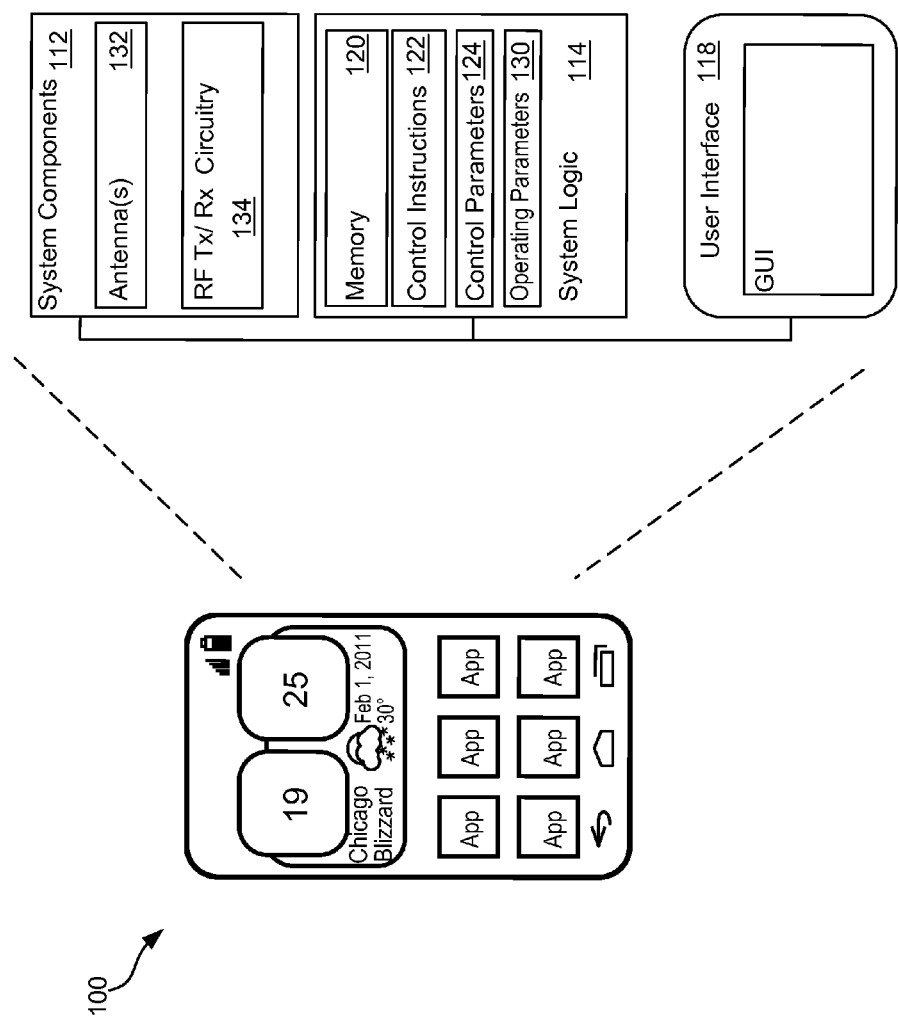
FIG. 1 shows an example of user equipment that includes an analog to digital converter.

FIG. 1 shows an example of user equipment (UE) 100 the can implement the described receiver architectures. User equipment may take many different forms and have many different functions. As one example, user equipment may be a 2G, 3G, or 4G/LTE cellular phone capable of making and receiving wireless phone calls, and transmitting and receiving data. The user equipment may also be a smartphone that, in addition to making and receiving phone calls, runs any number or type of applications.

User equipment 100 may be virtually any device that transmits and receives information, including as additional examples a driver assistance module in a vehicle, an emergency transponder, a pager, a satellite television receiver, a networked stereo receiver, a computer system, music player, or virtually any other device. The techniques discussed below may also be implemented in a base station or other network controller that communicates with the user equipment (UE).

The user equipment 100 can include among other things system components 112, system logic 114 and a user interface 118. System logic 114 can be part of the implementation of desired functionality in the UE 100. In that regard, the system logic 114 may include logic that facilitates, as examples, running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The user interface 118 may include a graphical user interface (GUI), touch sensitive display, voice, facial and gesture recognition inputs, buttons, switches, speakers and other user interface elements.

The system logic 114 can include memory 120, control instructions 122, control parameters 124 and operating parameters 130. The system components 112 may be implemented, for example, in a system on a chip (SoC), application specific integrated circuit (ASIC), or other circuitry. In the system components 112 a communication interface can include Radio Frequency (RF) transmit (Tx) and receive (Rx) circuitry 134 to handle transmission and reception of signals through one or more antennas 132.

As implementation examples, the system components 112 may include BCM4345, BCM4349, BCM434547 or BCM43430 wireless local area network (WLAN) chips or combo chips. These devices or other similar system solutions may be extended to provide the additional functionality described below. These integrated circuits, as well as other hardware and software implementation options for the user equipment 100, are available from Broadcom Corporation of Irvine Calif.

The transmitted and received signals may adhere to any of a diverse array of formats, protocols, modulations (e.g., QPSK, 16-QAM, 64-QAM, or 256-QAM), frequency channels, bit rates, and encodings. As one example, the system components 112 may support transmission and reception under multiple protocols. For example, WLAN, ANT, Bluetooth, and Bluetooth Low Energy (BLE) standards. Corresponding protocol stacks may be included in the memory 120. The techniques described below, however, are applicable to other communications technologies.

Figure 2:
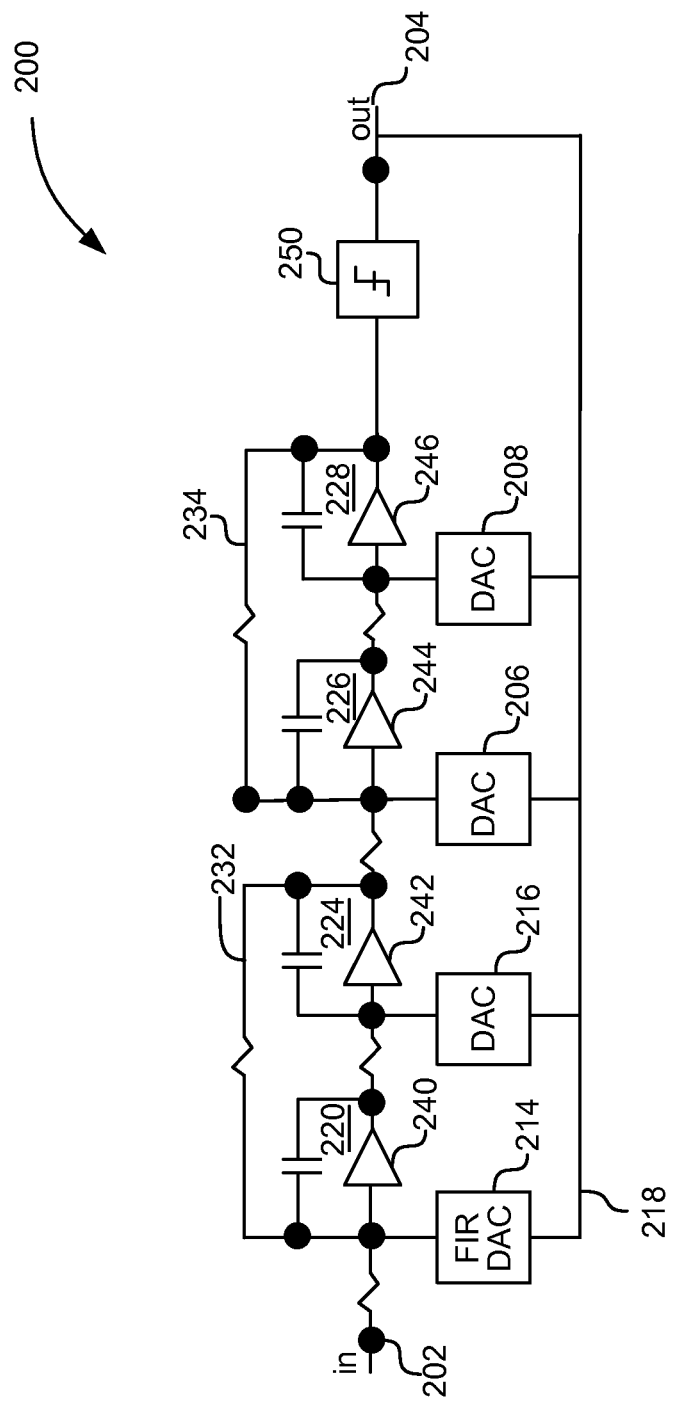
FIG. 2 is a circuit diagram of an exemplary feedback continuous-time, sigma-delta ADC.

FIG. 2 is a circuit diagram of an exemplary feedback, continuous-time (CT) sigma-delta (ΣΔ) ADC 200. The ADC 200 includes an input 202 and an output 204. To provide stability in a high-order loop the ADC 200 includes multiple digital-to-analog converters 206, 208, 214, 216 connected between the input 202 and the output 204. More or less DAC's may be used depending on an implementation.

Continuous time ΣΔ ADCs can be inherently antialiasing, power and area efficient but performance can be degraded by wideband phase noise in the feedback DAC 214. Finite impulse response (FIR) DAC's 214, 216 can mitigate this effect by filtering out-of-band (OOB) noise in the loop. The FIR DAC 214 can introduce delay in the feedback loop but the feedback architecture may not be sensitive to delay in the outer loop 218. A comparator, quantizer 250 can connect an input of the integrators 220, 224, 226, 228 with the output

204. One example of the comparator is a latch. Other comparators may be used depending on an implementation.

The ADC 200 includes integrators 220, 224, 226, 228. Feedback architectures include an inherent low-pass signal transfer function (STF) good for blockers. But the ADC's signal scaling may result in many noise contributors and higher power consumption of the integrators 220, 224, 226, 228. Additionally or alternatively, the ADC 200 may need to be reset when overloaded due to the nested memory of the integrators 220, 224, 226, 228.

Figure 3:
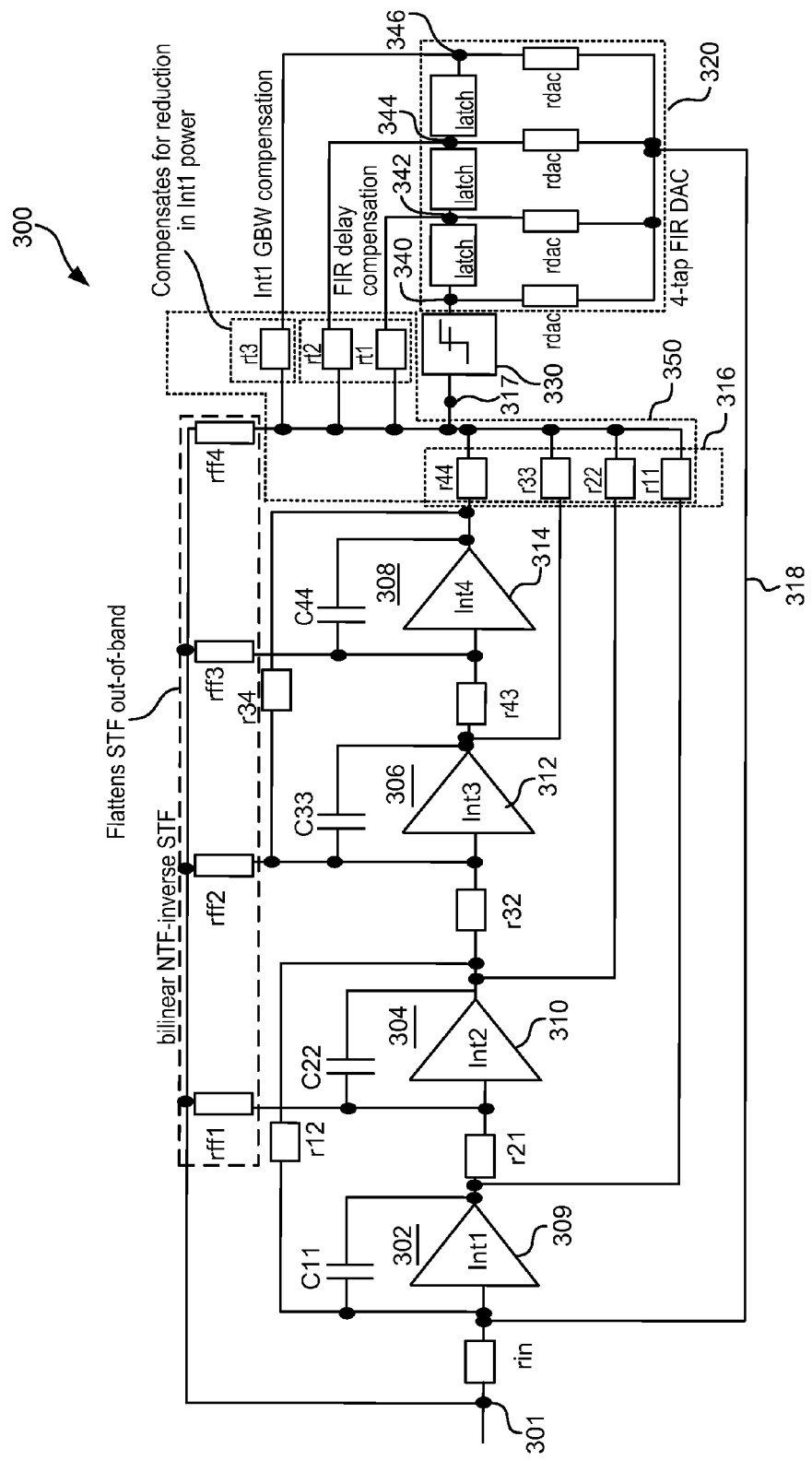
FIG. 3 is a circuit diagram of an exemplary single bit, feed-forward continuous-time sigma-delta ADC 300.

FIG. 3 is a circuit diagram of an exemplary single bit, feed-forward (e.g., continuous-time sigma-delta) ADC 300. The ADC 300 includes an input 301 followed by integrators 302, 304, 306, 308, or other element that can generate an output voltage proportional to a magnitude and duration that an input voltage signal has deviated from a determined voltage, e.g., 0 volts. The input 301 receives a communication signal or other voltage signal. More or less numbers of integrators 302, 304, 306, 308 may be used depending on an implementation. In one example, the integrators can operate as low pass filters. The integrators 302, 304, 306, 308 include amplifiers 309, 310, 312, 314, capacitors C11, C22, C33, C44 and resistors rin, r21, r32, r43. The integrators 302, 304, 306, 308 determine an integrated signal from the incoming communication signal.

A voltage input signal at input 301 is converted to a current by rin. A bandwidth of the integrators 302, 304, 306, 308 of the ADC 300 can typically go from a wider frequency to a narrower frequency, from the input 301 to a comparator, quantizer 330. Therefore, fewer filter components contribute to the overall noise. The resistors r12, r34 and the integrators 302, 304, 306, 308 combine to create two low-pass resonators, e.g., notch resonators. The outputs of the integrators 302, 304, 306, 308 can be combined by resistors r11, r22, r33, r44 which provides a passive summer 316 for the feed-forward loops of the integrators 302, 304, 306, 308. The passive summer 316 can be replaced with other elements, e.g., a capacitive summer such as switched capacitor for the reduction in area. The output 317 of the passive summer 316 can be input to the comparator, quantizer 330 to compare the integrated signal to a determined value to produce a quantized signal, e.g., a zero or one bit. Additionally or alternatively, an active summer can be used.

The feedback path 318 of the ADC 300 is fast and includes low noise. Therefore, a circuit delay element, e.g., the FIR DAC 320, can connect with integrator 302, e.g., to reduce a jitter contribution to noise. The FIR DAC 320 converts the quantized signal received from the comparator, quantizer 330 from a digital to an analog signal and feeds the converted signal back to the first integrator 302 input. The FIR DAC 320 can include resistors rdac and latches to provide four taps 340, 342, 344, 346. More or less taps can be used. The FIR DAC 320 can include four, half cycle delays for a total of two cycle delays.

The FIR DAC 320 can receive an output of the comparator, quantizer 330 at the first tap 340. To form an adjustable delay element, resistors rt1, rt2, or other compensation element, can connect with the second and third taps 342, 344 respectfully. The resistor rt1, rt2 compensate for the delay of the FIR DAC 320 around loop 318. Resistor rt3, or other compensation element, connects with the fourth tap 346 of the FIR DAC 320 to adjust for a gain-bandwidth of the first integrator 302. For example, a resistance of the resistor rt3 can be decreased to compensate for a reduction in the power of integrator 302. The resistors rt1, rt2, rt3 can be programmable, binary weighted resistors to compensate for different delays and gain-bandwidth.

The resistors r11, r22, r33, r44, rt1, rt2 and rt3 together can provide for delay compensation 350. The integrators 302, 304, 306, 308 feed-forward their integrated signals to the comparator, quantizer 330 via the passive summer 316, e.g., resistors r11, r22, r33, r44. The ADC 300 does not need to be reset upon overload because of the feed-forward implementation. The ADC 300 provides signal scaling for fewer noise contributors and lower power, and does not irreversibly overload but it may be sensitive to FIR DAC 320 and integrator finite gain-bandwidth (GBW) delay. The FIR DAC delay compensation resistors rt1, rt2 have N=M/2 taps, where M is the number of half rate FIR taps. The integrator GBW compensation resistor rt3 makes for N+1 taps so that integrator 302 power can be reduced. A recreated signal output from the passive summer 316 is input to the comparator, quantizer 330.

Since the STF may have a tendency to peak out-of-band, resistors rff1, rff2, rff3, rff4, or other flattening element, can flatten the STF out-of-band. The resistors rff1, rff2, rff3, rff4 can provide a bilinear NTF-inverse STF. The resistors can be replaced with another element such as a switched capacitor or a programmable switched capacitor. The resistors rff1, rff2, rff3, rff4 or switched capacitors connect the analog-to-digital input 301 with the comparator input 317 and or inputs of the integrators 302, 304, 306, 308. The resistor rff1 can connect with the input of the second amplifier 310, resistor rff2 can connect with the input of the third amplifier 312, resistor rff3 can connect with the input of the fourth amplifier 314, and resistor rff4 can connect with the input of passive summer 316. The STF choice is flexible, but a flat STF can result in a good balance. Compared to an equivalent feedback FIR DAC ADC, the feed-forward FIR DAC ADC 300 can use half the power in same area for same signal-to-noise ratio (SNR) with a smooth saturation and smooth performance loss in the presence of strong signal/blockers. Additionally or alternatively, a filter need not be connected before the ADC 300 to avoid anti-aliasing.

Figure 4:
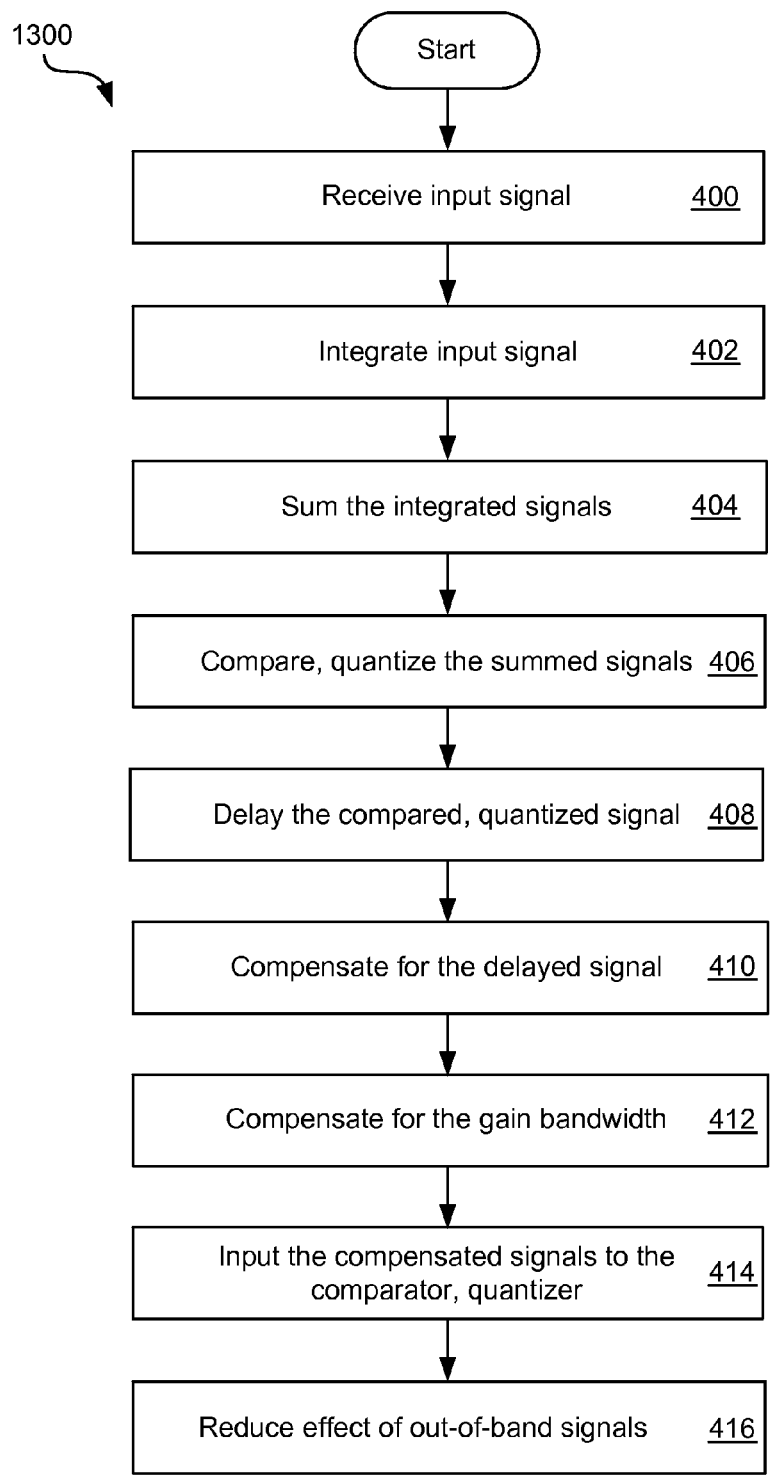
FIG. 4 is a flowchart of an exemplary implementation of the feed-forward continuous-time sigma-delta ADC.

FIG. 4 is a flowchart of an exemplary implementation of the feed-forward (e.g., continuous-time sigma-delta) ADC 300. In one example, the ADC received a voltage input signal and converts it to a current (400). The input signal is integrated (402). Outputs of the integrators 302, 304, 306, 308 are fed forward to the passive summer 316 (404). The summed signal is compared, quantized (406). The quantized signal is delayed (408). A weight of the delayed signal is compensated for jitter (410). The gain-bandwidth can also be compensated for an integrator (412). The compensated for signal are feedback paths to the comparator, quantizer (414). The effect of out-of-band signal can be reduced (416).

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments have been described, it can be apparent that many more embodiments and implementations are possible. Accordingly, the embodiments are not to be restricted.

What is claimed is:

1. A system, comprising:
   an input to receive a communication signal;
   an integrator connected with the input, the integrator to determine an integrated signal from the communication signal;
   a comparator, an output of the integrator connected with an input of the comparator, the comparator to quantize the integrated signal to produce a quantized signal;
   a digital-to-analog convertor connected between an output of the comparator and the output of the integrator and connected between the output of the comparator and an input of the integrator, the digital-to-analog convertor to convert the quantized signal to a delayed analog signal; and
   a compensation element connected with the digital-to-analog convertor, the compensation element to adjust a weight of the delayed analog signal, the comparator to receive the adjusted, delayed analog signal.

2. The system of claim 1, where the compensation element comprises a passive summer.

3. The system of claim 2, where the passive summer comprises a plurality of resistors or switched capacitors.

4. The system of claim 1, where the compensation element adjusts for a reduction in power of the integrator.

5. The system of claim 1, further comprising an out-of-band flattening element connected between the input and the comparator.

6. The system of claim 5, where the out-of-band flattening element comprises a resistor or a switched capacitor.

7. The system of claim 1, where the digital-to-analog convertor comprises a finite impulse response digital-to-analog convertor.

8. The system of claim 1, where the compensation element comprises a programmable resistor or a programmable switched capacitor.

9. An analog-to-digital converter, comprising:
   an input to receive a communication signal;
   an integrator connected with the input, the integrator to determine an integrated signal from a communication signal;
   a comparator connected with the integrator, the comparator to quantize the integrated signal to produce a quantized signal; and
   a flattening element connected between an output of the integrator and the input, the flattening element to flatten an out-of-band signal transfer function of the integrator.

10. The analog-to-digital converter of claim 9, further including an adjustable delay element to provide a delayed quantized signal to the comparator.

11. The analog-to-digital converter of claim 10, where the adjustable delay element comprises a finite impulse response digital-to-analog convertor.

12. The analog-to-digital converter of claim 9, further including a compensation element connected with the comparator to adjust for a reduction in power of the integrator or compensate for a delay.

13. The analog-to-digital converter of claim 12, where the compensation element comprises a programmable resistor or a programmable switched capacitor.

14. The analog-to-digital converter of claim 12, where the compensation element comprises a passive summer.

15. The analog-to-digital converter of claim 9, where the flattening element comprises a resistor or a switched capacitor.

16. A method for converting an analog signal to a digital signal, comprising:
   integrating an input signal with a plurality of integrators;
   comparing, with a comparator, the integrated signals to a determined value to provide a quantized signal;
   delaying the quantized signal;
   adjusting the delayed signal with a compensation element; and
   inputting the adjusted signal to the comparator.

17. The method of claim 16, further comprising, summing outputs of the plurality of integrators before the comparing.

18. The method of claim 16, further comprising converting the quantized signal to an analog signal before the adjusting.

19. The method of claim 18, further comprising compensating for a reduction in power of at least one of the integrators.

20. The method of claim 16, further comprising reducing out-of-band signal transfer functions.

* * * * *